United States Patent
Frish et al.

(10) Patent No.: US 12,197,004 B2
(45) Date of Patent: Jan. 14, 2025

(54) SILICON PHOTONIC INTEGRATED CIRCUITS ON SUBSTRATES WITH STRUCTURED INSULATORS HAVING SPECIFIC THICKNESSES IN SEPARATE ZONES

(71) Applicant: Intel Corporation, Santa Clara, CA (US)

(72) Inventors: Harel Frish, Albuquerque, NM (US); John Heck, Berkeley, CA (US); Randal Appleton, Albuquerque, NM (US); Stefan Meister, Portland, OR (US); Haisheng Rong, Pleasanton, CA (US); Joshua Keener, Albuquerque, NM (US); Michael Favaro, Edgewood, NM (US); Wesley Harrison, Portland, OR (US); Hari Mahalingam, San Jose, CA (US); Sergei Sochava, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 615 days.

(21) Appl. No.: 17/358,912

(22) Filed: Jun. 25, 2021

(65) Prior Publication Data

US 2022/0413213 A1     Dec. 29, 2022

(51) Int. Cl.
*G02B 6/12*     (2006.01)
*G02B 6/122*     (2006.01)
*H01S 5/026*     (2006.01)

(52) U.S. Cl.
CPC ....... *G02B 6/12019* (2013.01); *G02B 6/1225* (2013.01); *H01S 5/026* (2013.01);
(Continued)

(58) Field of Classification Search
CPC .......... G02B 6/12019; G02B 6/1225; G02B 6/1228; G02B 6/136; G02B 6/12004;
(Continued)

(56) References Cited

U.S. PATENT DOCUMENTS 7,760,980 B2 *   7/2010    West .................... G02B 6/1347
                                                                                                                                         385/129
9,110,233 B2 *   8/2015    Kim ........................ G02F 1/035
(Continued)

OTHER PUBLICATIONS

Bruel, M., "Silicon on insulator material technology", Electronics Letters, vol. 31, No. 14, Jul. 6, 1995, 2 pgs.

*Primary Examiner* — Andrew Jordan
(74) *Attorney, Agent, or Firm* — Essential Patents Group, LLP

(57) ABSTRACT

Silicon photonic integrated circuit (PIC) on a multi-zone semiconductor on insulator (SOI) substrate having at least a first zone and a second zone. Various optical devices of the PIC may be located above certain substrate zones that are most suitable. A first length of a photonic waveguide structure comprises the crystalline silicon and is within the first zone, while a second length of the waveguide structure is within the second zone. Within a first zone, the crystalline silicon layer is spaced apart from an underlying substrate material by a first thickness of dielectric material. Within the second zone, the crystalline silicon layer is spaced apart from the underlying substrate material by a second thickness of the dielectric material.

22 Claims, 8 Drawing Sheets

(52) U.S. Cl.
CPC .............. *G02B 2006/12061* (2013.01); *G02B 2006/1213* (2013.01); *G02B 2006/12164* (2013.01)

(58) Field of Classification Search
CPC .. G02B 2006/12061; G02B 2006/1213; G02B 2006/12164; G02B 2006/12078; G02B 2006/12135; H01S 5/026
See application file for complete search history.

(56) References Cited

U.S. PATENT DOCUMENTS

| | | | |
|---|---|---|---|
| 9,223,088 B2* | 12/2015 | Kobayashi | G02B 6/136 |
| 9,316,789 B2* | 4/2016 | Kim | G02B 6/124 |
| 10,914,892 B2* | 2/2021 | Bayn | H01L 31/105 |
| 2013/0170784 A1* | 7/2013 | Kim | G02B 6/124 |
| | | | 385/14 |
| 2015/0277046 A1* | 10/2015 | Kobayashi | G02B 6/136 |
| | | | 438/69 |
| 2015/0309255 A1* | 10/2015 | Kim | G02B 6/132 |
| | | | 438/197 |
| 2020/0124791 A1* | 4/2020 | Bayn | H01L 31/02327 |
| 2022/0413213 A1* | 12/2022 | Frish | G02B 6/1225 |
| 2023/0083043 A1* | 3/2023 | Scofield | G02B 6/131 |
| | | | 385/14 |

* cited by examiner

SILICON PHOTONIC INTEGRATED CIRCUITS ON SUBSTRATES WITH STRUCTURED INSULATORS HAVING SPECIFIC THICKNESSES IN SEPARATE ZONES

BACKGROUND

A photonic integrated circuit (PIC) includes integrated photonic devices or elements. PICs are preferred to optical systems built with discrete optical components and/or optical fiber because of their more compact size, lower cost, heightened functionality, and/or performance Silicon PICs (SiPh) have one or more planar silicon photonic waveguide structures, typically of a diameter less than 1 µm, which convey light within the PIC. These planar silicon waveguides terminate at an optical output coupler (OC) suitable for coupling to an optical fiber array (FA) comprising fibers, which may have diameters on the order of a hundred microns, for example.

A PIC may include passive and active optical devices, and depending on optical, thermal, and/or electrical/RF properties of each these devices, a particular substrate may be advantageous for one device, but detrimental to another. A PIC that integrates multiple devices may therefore suffer performance limitations that are associated with any one substrate architecture.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
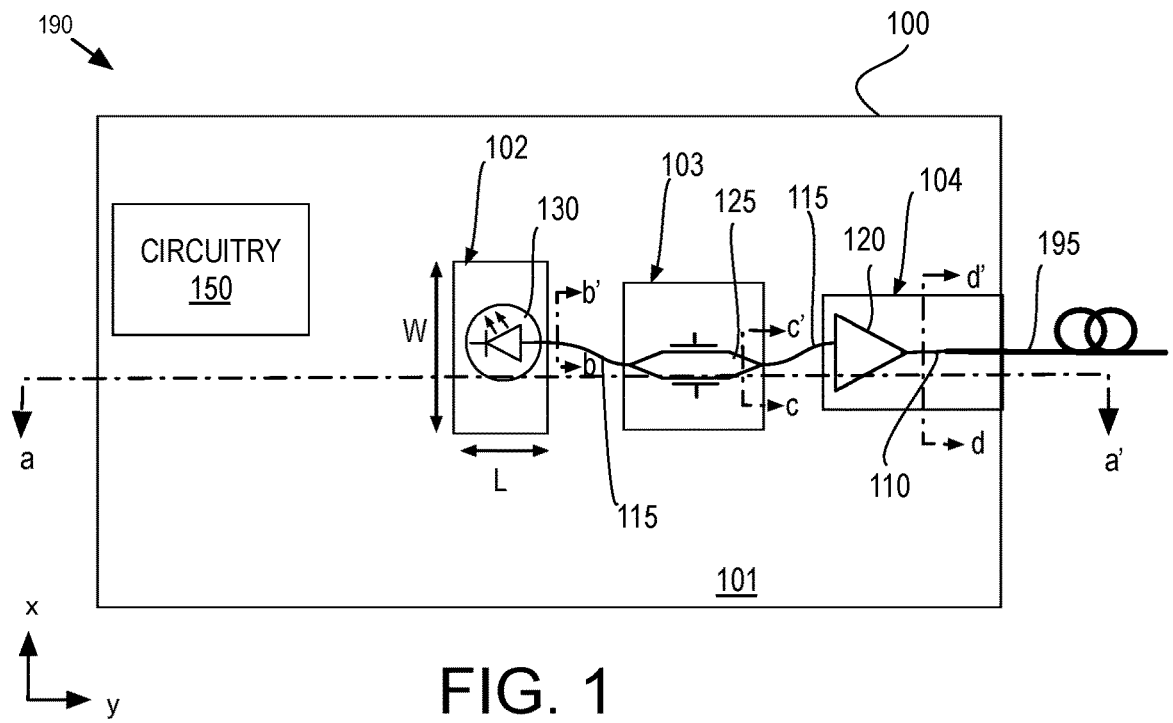
FIG. 1 is a top-down plan view of a PIC including multiple lengths of a waveguide structure that are located over multiple zones of a structured substrate, in accordance with some embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is no more than incidental variation from a target value. For example, a composition that is substantially a first constituent means the composition may further include only trace levels of any substitutional constituent. A composition that is substantially a first and second constituent means the composition may further include only trace levels of any constituent substituted for either the first or second constituent.

FIG. 1 is a plan view of a PIC 190 comprising a multi-zoned substrate 100 that includes at least a first zone 101, and additional zones 102, 103, and 104. As described further below, the architecture of substrate 100 varies between zones 101, 102, 103 and 104. PIC 190 further includes one or more photonic or optical waveguide structures that span the first zone 101 as well as zones 102, 103 or 104. For example, one or more first passive or active optical devices may be fabricated within, or over, first zone 101 while one or more second passive or active optical devices are fabricated within, or over one or more of zones 102, 103 or 104. In exemplary embodiments, the first passive or active optical device is in optical communication with the second passive or active optical device through one or more photonic/optical waveguide structures. The photonic/optical waveguide structures may vary depending on architecture and/or function of the passive or optical device, and may also vary depending on the architecture of the substrate within the particular zone that the optical device is located.

PIC 190 includes an optical/photonic waveguide structure 115, which spans one or more lengths over substrate zone 101. One or more optical devices may be over or within each of substrate zones 102, 103, 104. The optical devices are optically coupled together by photonic waveguide structures, some segments of which comprise waveguide structure 115. Optical waveguide structures are of materials having sufficient index contrast with an optical cladding material to guide electromagnetic waves in the optical spectrum (hv) along a longitudinal waveguide length.

Optical devices of a PIC are waveguide-based devices, each comprising one or more optical waveguide structure. PIC 190 includes at an optical waveguide edge coupler 110, an optical multiplexer/demultiplexer 120, an optical (e.g., Mach Zehnder) modulator 125, and a laser 130. Edge coupler 110 comprises an optical waveguide structure that terminates at a facet through which light is to couple with an optical fiber 195 that may be attached to PIC 190. Optical de/mux 120 may be either of an array waveguide grating (AWG) or an Echelle grating, for example, and is capable of distinguishing optical wavelengths. Each type of WDM grating comprises at least one optical waveguide structure. Similarly, MZ modulator 125 also includes optical waveguide structures to induce a modulation of light propagated through PIC 190. Laser 130 likewise includes one or more optical waveguide structures. In some embodiments, laser 130 is a hybrid laser including a III-V device evanescently coupled to a length of an optical waveguide that is further coupled with other devices of PIC 190.

PIC 190 further includes circuitry 150, which may be electrically coupled to one or more of optical devices 110, 120, 125 or 130, for example through interconnect metallization. Circuitry 150 further comprises (e.g., CMOS) transistor circuitry that, for example, may comprise optical device driving and/or sensing circuitry. An active optical device is electrically connected to circuitry 150, while a passive optical device need not be electrically connected to circuitry 150. Circuitry 150 may be electrically coupled to each of laser 130 and modulator 125, as exemplary active devices. Optical de/mux 120 and waveguide edge coupler 110 are exemplary passive optical devices.

For PIC embodiments including a waveguide edge coupler 110, and/or optical multiplexer/demultiplexer 120, these devices, along with any associated waveguide structures, may be advantageously located within, or over, substrate zone 104, which has a different substrate architecture than substrate zone 101. For PIC embodiments including optical modulator 125, waveguide structures associated with modulator 125 are located within or over substrate zone 103. Substrate zone 103 has a different substrate architecture than substrate zones 101 or 104. For PIC embodiments including laser 130, laser 130 is located within or over substrate zone 102. Substrate zone 103 has a different substrate architecture than substrate zones 101, 103 or 104. Although PIC 190 includes four exemplary photonic devices 110, 120, 125 and 130 to best illustrate certain advantages, a PIC may include only a subset of the illustrated optical devices and/or substrate zones. A PIC may also include other photonic devices that are not illustrated in FIG. 1, but are nonetheless implemented within similar substrate zones.

As shown in FIG. 1, each substrate zone 102, 103 and 104 is substantially surrounded by substrate zone 101. Substrate zone 101 completely surrounds all edges of substrate zones 102 and 103. Substrate zone 101 surrounds all but one edge of substrate zone 104 because an edge of substrate 100 passes through substrate zone 104. In other embodiments where the edge of substrate 100 is separated from substrate zone 104, substrate zone 101 may completely surround substrate zone 104 in a manner similar to substrate zones 102 and 103. Substrate zone 101 is referred to herein as a "primary" substrate zone while the other zones are referred to as "secondary" substrate zones.

Each secondary substrate zone 102, 103 and 104 has a zone length L and zone width W. The area or footprint of substrate 100 occupied by each secondary substrate zone is equal to the product of zone length L and zone width W. While secondary zones 102-104 are illustrated as rectangular polygons for the sake of simplicity, a secondary substrate zone may have any arbitrary shape. Regardless of shape, secondary substrate zones 102-104 can be relatively large. Although implementations may vary, in exemplary embodiments at least one of zone length L and zone width W is on the order of tens of micrometers, and may be on the order of hundreds of micrometers or even multiple millimeters. In exemplary embodiments, the zone area of a secondary zone is at least 100 μm² and may be 1 mm², or more. Advantageously, a secondary zone has an area at least large enough to accommodate lengths of a waveguide structure associated with a particular optical device. Depending on the density of PIC 190, secondary substrate zones may be much larger than any particular optical device located within the secondary substrate zone. More than one optical device may also be located within a single secondary substrate zone. Although each secondary zone illustrated in FIG. 1 is separated from another secondary zone by intervening primary substrate zone 101, different secondary zones may be immediately adjacent to each other (i.e., abutting). One secondary zone may also be located completely within another secondary zone, etc.

In exemplary embodiments, substrate 100 is a semiconductor-on-insulator (SOI) substrate that includes a crystalline (e.g., substantially monocrystalline) semiconductor device layer. Within substrate zone 101, the semiconductor device layer is spaced apart from an underlying substrate material by a first thickness of dielectric material. Within at least one of the secondary zones 102, 103, 104, the substrate architecture differs so that semiconductor layer is instead spaced apart from the underlying substrate material by a second thickness of dielectric material that is significantly different from the first thickness. In accordance with some embodiments, the second thickness is at least twice the first thickness. In alternative embodiments, the first thickness is instead at least twice the second thickness. A PIC may include a substrate with a plurality of secondary zones of differing dielectric material thickness. For example, where both substrate zones 103 and 104 have a greater thickness of dielectric material than substrate zone 101, dielectric material within substrate zone 103 may have a different thickness than dielectric material within substrate zone 104.

In further embodiments, within at least one substrate zone, the substrate architecture includes a heat dissipating material between the semiconductor device layer and the underlying substrate material. The heat dissipation material has a higher thermal conductivity K (W/mk$^{-1}$) than the dielectric material that is otherwise between the semiconductor device layer and underlying substrate material. As such, the heat dissipation material may provide thermal shunts between an optical device and the underlying substrate material, where thermal conduction is more rapid. For such embodiments, a structure substrate includes zone that may reduce local hot spots, for example where power density is highest, within a PIC.

Figure 2:
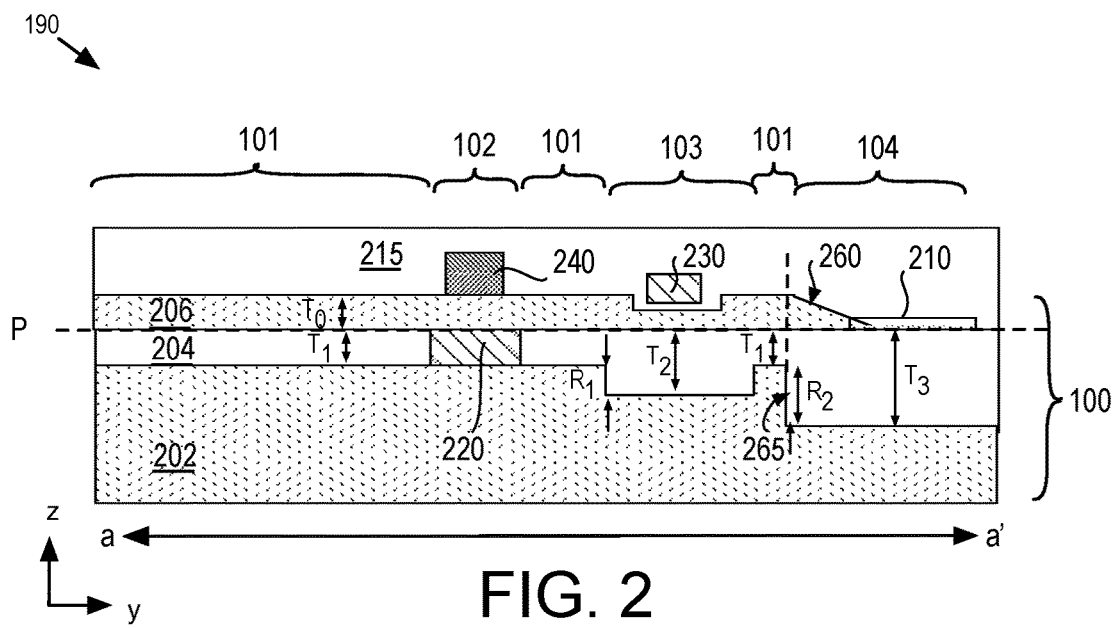
FIG. 2 is a cross-sectional view of the PIC introduced in FIG. 1, in accordance with some embodiments.

FIG. 2 is a cross-sectional view of PIC 190, in accordance with some embodiments. As shown, substrate 100 includes a semiconductor device layer 206 over a dielectric material 204, which spaces device layer 206 from an underlying substrate material 202. In exemplary embodiments, device layer 206 is \(mono)crystalline silicon. Device layer 206 may also be of an alternative semiconductor material, such as germanium, SiGe, III-N, etc. Dielectric material 204 may be of any chemical composition suitable as electrical isolation and/or as optical cladding of sufficient index contrast with semiconductor device layer 206. In exemplary embodiments where device layer 206 is silicon, dielectric material 204 is primarily silica (SiO$_2$) Substrate material 202 may be any material suitable as a handle or carrier material. In some exemplary embodiments, substrate material 202 is (mono) crystalline silicon.

As further illustrated in FIG. 2, within substrate zone 101, optical waveguide structures include device layer 206 (e.g., crystalline silicon) over dielectric material 204 that has a thickness $T_1$. Dielectric material 204 of thickness $T_1$ provides a bottom cladding of adequate thickness and index contrast for waveguide structures of PIC 190. In exemplary embodiments, thickness $T_1$ is approximately 1 μm, or less. Within substrate zone 103, optical waveguide structures again include device layer 206, but dielectric material 204 instead has a thickness $T_2$. In exemplary embodiments, the thickness $T_2$ is at least twice the thickness $T_1$ (e.g., 2 μm). As noted above, modulator 125 is within substrate zone 103 and, for example, includes a resistive heater element 230 over a length of a waveguide structure comprising semiconductor device layer 206. The greater thickness of dielectric material 204 within substrate zone 103 may, for example, reduce local thermal conduction between device layer 206 and substrate material 202. Accordingly, resistive heater element 230 may better stabilize temperatures of waveguide structures of modulator 125 within substrate zone 103.

Within substrate zone 103, optical waveguide structures 210 and 260 are spaced apart from substrate material 202 by dielectric material 204 of a thickness $T_3$. In exemplary embodiments, thickness $T_3$ is at least three times thickness T1, with one example being approximately 3 μm. Thickness T3 may be selected to reduce or prevent leakage of the optical mode(s) propagated within the waveguide structures 210 and 260, which in the illustrated example are structures associated with optical de/mux 120 (FIG. 1).

At least a portion of substrate zone 104 lacks device layer 206. Waveguide structure 210 therefore has a different composition than device layer 206. In exemplary embodiments, waveguide structure 210 comprises a compound of silicon and nitride (i.e., silicon nitride, or SiN). Waveguide structure 210 may be either silicon rich or silicon lean silicon nitride to achieve a desired index of refraction. The index contrast between silicon nitride and dielectric material 204 is significantly lower than for a waveguide structure of silicon. Hence, optical mode(s) propagated along waveguide structure 210 may expand into dielectric material 204 to a thickness greater than thickness $T_2$, for example. The greater thickness $T_3$ may therefore better prevent modes from leaking (coupling) into substrate material 202.

Waveguide structure 260 is a transition between waveguide structure 210 of lower index material to the higher index material device layer 206. In this example, waveguide structure 260 is tapered down from a thickness $T_0$ to some lesser thickness. As shown by dashed line, the tapered transition is located relative to a recess sidewall 265 in substrate 202 demarking the boundary of substrate zone 104 so that the tapered transition is over or within substrate zone 104. Hence, not all waveguide structures within substrate zone 104 have the same composition. Since the tapered transition induces expansion of the optical mode deeper into dielectric material 204, the tapered transition is advantageously located entirely within substrate zone 104.

As further shown in FIG. 2, device layer 206 interfaces with dielectric material 204 along a plane P of substrate 100. As demarked with dashed line, plane P is at a top of dielectric material 204 for all of the different thicknesses T1, T2 and T3 of. Hence, over the entirety of substrate 100, a top surface of dielectric material 204 is substantially planar, regardless of the dielectric material thickness within a particular substrate zone. All optical waveguide structures of PIC 190 are therefore co-planar (e.g., on the plane P) regardless of whether the waveguide structure comprises device layer 206*m* or an alternative waveguide material (e.g., silicon nitride).

In zones where the dielectric material is of a thickness greater than T1, substrate material 202 is recessed relative to a reference substrate surface intersecting plane P within substrate zone 101. Substrate zones 103 and 104 are therefore be surrounded by a sidewall of a recess defined in substrate material 202. The different recess depths R1 and R₂ integrated into substrate 100 render substrate 100 what is referred to herein as a multi-zoned substrate with a 3D structured insulator. Different optical devices of PIC 190 that are aligned to substrate zones 101-104 during their manufacture may accordingly achieve improved performance as a function of the different substrate architectures associated with each of the substrate zones.

As further illustrated in FIG. 2, a laser emitter 240 is optically coupled with a waveguide structure fabricated within substrate zone 102. In this example, the waveguide structure comprises device layer 206 (e.g., silicon). Within substrate zone 102, there is heat dissipation material 220 between device layer 206 and substrate material 202. Heat dissipation material 220 may be any material that has a higher thermal conductivity than dielectric material 204. Heat dissipation material 220 may include a metal, for example. In some embodiments, heat dissipation material 220 comprises at least one of Si, W, Al, or a nitride thereof. For some embodiments, heat dissipation material 220 is AlN, which has a high thermal conductivity and will not significantly couple optically with an overlying waveguide structure comprising silicon. For such embodiments, substrate zone 102 may comprise only heat dissipation material 220 (i.e., no dielectric material 204 present). In other embodiments, heat dissipating material 220 is silicon or silicon nitride, which, like W, or other metal/metal nitride embodiments, can be expected to alter waveguide performance to some extent. For such embodiments, heat dissipation material may be localized, for example, as slugs/filled vias embedded within dielectric material 204. Heat dissipation material may therefore also be arrayed over the area of substrate zone 102, accordingly to some 2D pitch, for example. Although heat dissipation material may have any thickness, it is advantageously embedded within dielectric material that is of minimal thickness (e.g., thickness T1) to minimize the length of the thermal shunts.

FIG. 2 further illustrates an upper cladding material 215 that is over a top surface of all waveguide structures in PIC 190. Upper cladding material 215 may be any composition offering sufficient index contrast with the waveguide structures. In exemplary embodiments where waveguide structures comprise silicon or silicon nitride, upper cladding material 215 is primarily silica ($SiO_2$) Impurities, such as C, H, or N may also be present within cladding material 215.

Figure 3A:
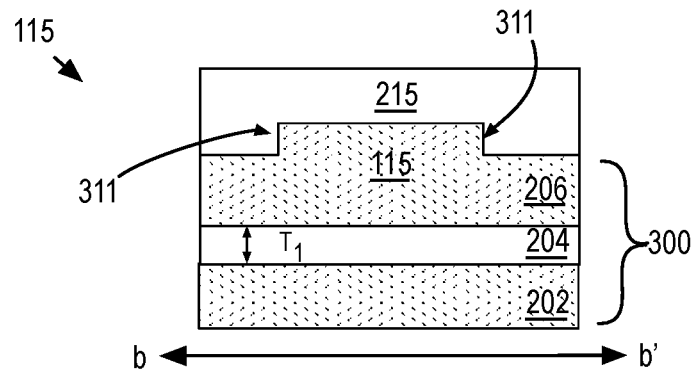
FIGS. 3A, 3B and 3C are cross-sectional views through different lengths of waveguide structures in the PIC illustrated in FIG. 1, in accordance with some embodiments.
Figure 3B:
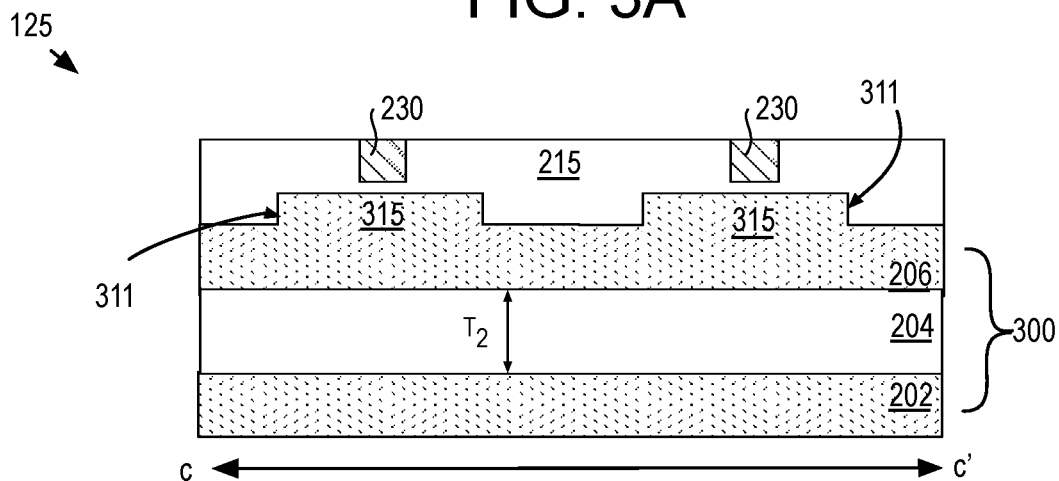
Figure 3C:
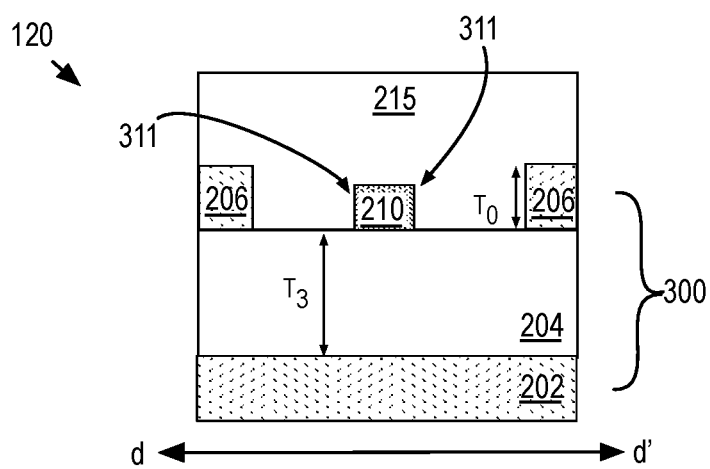

FIGS. 3A, 3B and 3C illustrate cross-sectional views of PIC 190 through the b-b', c-c' and d-d' dashed lines annotated in the plan view FIG. 1. Each of the cross-sectional views pass through a transverse width of an optical waveguide structure. The illustrated cross-sectional views therefore represent some length of waveguide structure that is within PIC 190.

FIG. 3A illustrates a sectional view of waveguide structure 115, which traverses lengths of substrate zone 101. As shown in FIG. 3A, waveguide structure 115 has a rib or ridge sidewall 311 defining a transverse waveguide width. Waveguide structure 115 is a patterned (partially etched) region of device layer 206 confining an optical mode as a core of a waveguide. The width waveguide structure 115 may vary with material composition and photonic wavelength, but for some embodiments where waveguide structure 115 is crystalline silicon, width ranges from 0.4 to 2 μm. Although not separately illustrated, a cross-sectional view through laser 130 (FIG. 1) may be substantially the same as waveguide structure 115 (FIG. 3A) with the addition of laser 240 over, or otherwise optically coupled to, waveguide structure 115. Heat dissipation material may be further present under the waveguide structure 115, for example as illustrated in FIG. 2.

FIG. 3B illustrates a sectional view of a pair of adjacent waveguide structures 315, which traverse lengths of substrate zone 103 and are portions modulator 125 (FIG. 1). As shown in FIG. 3B, each of waveguide structures 315 is similar to waveguide structure 115 (FIG. 3A), having a rib or ridge sidewall 311. Waveguide structures 315 are again patterned (partially etched) regions of device layer 206 and similarly covered with cladding material 215. As further illustrated in FIG. 3B, a resistive heater element 230 is over, or otherwise thermally coupled to, waveguide structures 315. Resistive heater element 230 comprises a material of higher electrical conductivity than cladding material 215. Resistive heater element 230 may comprises a metal, metal nitride, polysilicon, etc. that has a controlled electrical resistance that can provide joule heating independently to one or more of waveguide structures 315, for example to maintain waveguide structures 315 at a predetermined temperature. As noted above, in addition to optically cladding waveguide structures 315, the greater thickness $T_2$ of dielectric material 204 may better thermally insulate waveguide structures 315 as compared to dielectric material thickness $T_1$.

FIG. 3C illustrates a sectional view of waveguide structure 210, which traverses a length of substrate zone 104. As shown in FIG. 3B, waveguide structure 210 comprises a different material (e.g., silicon nitride) than co-planar device layer 206. Waveguide structure 210 has ridge sidewalls 311 that may define a smaller transverse width than waveguide structures 115 or 315, for example. Waveguide structure 210 may also have a ridge thickness less than device layer thickness $T_0$. Although sidewalls 311 are spaced laterally apart from device layer 206, and covered with cladding material 215, device layer 206 may nevertheless be present within substrate zone 104. Because of the lower index contrast of waveguide structure 210, optical modes may expand into the thickness $T_3$ of dielectric material 204. This larger mode expansion may be advantageous, for example where an end facet of waveguide edge coupler 110 (FIG. 1) is to interface to an optical fiber having a diameter of 100 μm, or more. Large mode expansion permitted by the greater thickness $T_3$ may also be advantageous for any other device that includes a waveguide structure of lower index contrast (e.g., silicon nitride waveguide structures). The cross-sectional view illustrated in FIG. 3C may therefore also be representative of de/mux 120 (FIG. 1).

Figure 4:
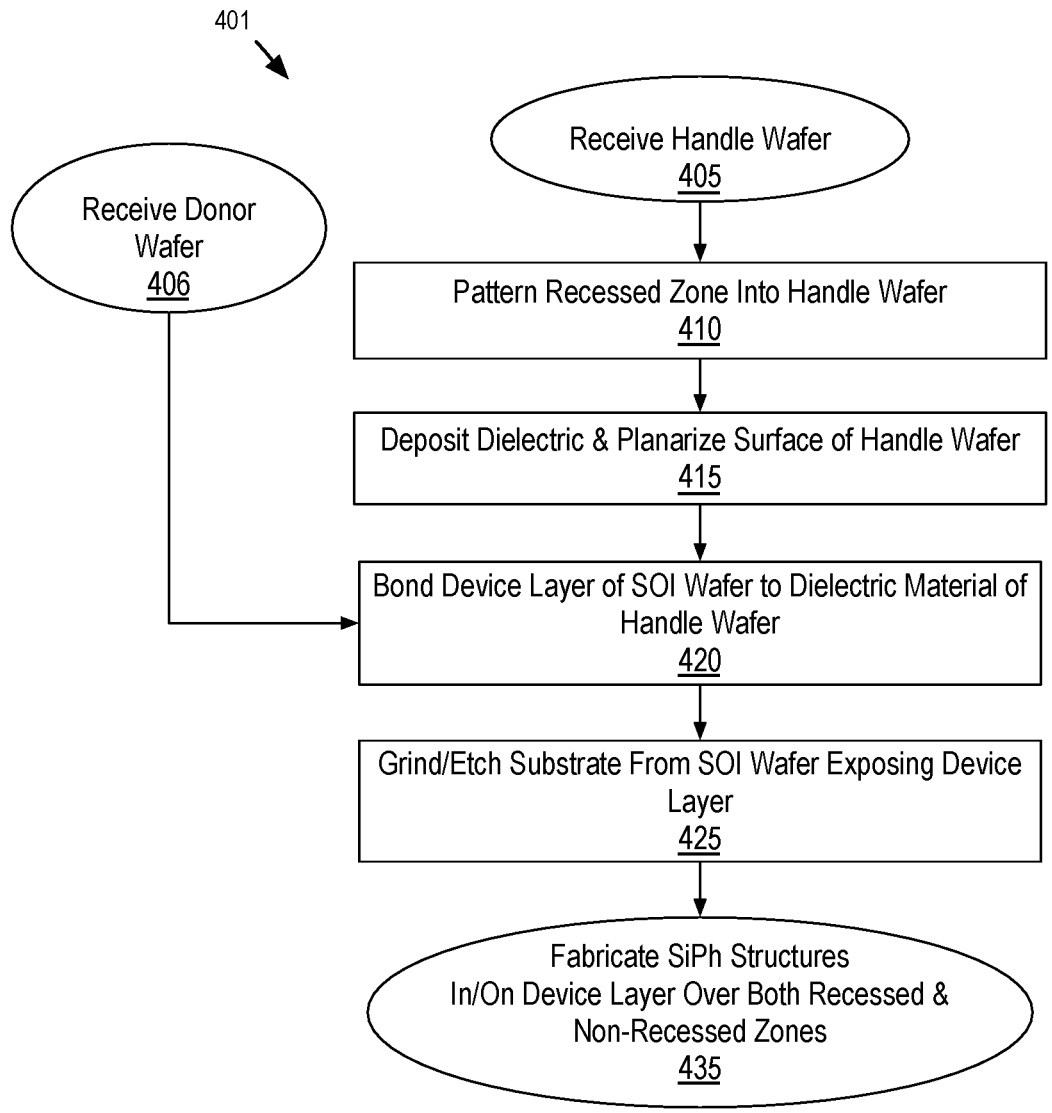
FIG. 4 is a flow diagram of methods for fabricating a PIC with waveguide structures over multiple zones of a substrate having a 3D structured insulator, in accordance with some embodiments.

PICs with multi-zoned structured substrates as described above may be fabricated according to a wide number of techniques and processes. FIG. 4 is a flow diagram of methods 401, in accordance with some embodiments. In methods 401 an SOI wafer is bonded with a handle wafer that is processed to have at least a planar dielectric material of different thicknesses. The PIC 190 is then fabricated in alignment to the structured substrate. FIG. 5A-5G illustrate substrate 300 evolving as selected operations in methods 401 are practiced in accordance with some embodiments to arrive at PIC 190 (FIG. 1). The cross-sectional view shown in FIG. 5A-5G are taken at the a-a' line denoted in FIG. 1.

Referring first to FIG. 2, methods 401 begin at input 405 where a handle wafer is received. The handle wafer may comprise a bare semiconductor material, such as (mono) crystalline silicon. At block 410, portions of the semiconductor within predetermined zones are etched to recess the surface relative to an unetched zone. Any patterning process known to be suitable for the semiconductor material may be practiced at block 410. For example, a photolithographic masking process followed by a plasma/dry etch and/or wet chemical etch may be practiced to form recesses of a desired area and recess depth. In the example illustrated in FIG. 3A, recesses 503 and 504 are etched into substrate material 202. As shown, recesses 503 and 504 are defined by sidewalls of substrate 300 that have a recess depth $R_1$ and $R_2$, respectively. Although not illustrated, photolithographic alignment marks may also be etched into substrate 300 concurrently with recesses 503, 504.

Returning to FIG. 4, methods 401 continue at block 415 where dielectric material is deposited over the handle wafer and a top surface of the dielectric material planarized. In the example illustrated in FIG. 5B, dielectric material 204 has been deposited by CVD to a thickness greater than thickness $T_3$. A top surface of dielectric material 204 is planarized, for example with a chemical mechanical polisher. After polishing, dielectric material 204 has multiple thicknesses, $T_1$, $T_2$, $T_3$ within different zones of the handle wafer. Once planarized, openings may be patterned into/through dielectric material 204. The openings may be filled with any other material, for example having greater thermal conductivity than dielectric material 204. Any dielectric patterning, backfill, and planarization processes known in the art may be practiced, for example as further illustrated in FIG. 5D, to embedded heat dissipation material 220 into dielectric material 204 to form a structured, multi-zoned handle substrate 510.

Methods 401 (FIG. 4) continue with the receipt of a donor wafer at input 406. The donor wafer includes a semiconductor device layer that is to be transferred to the handle wafer. In exemplary embodiments, the donor wafer received at input 406 is an SOI wafer. At block 420, the device layer of the donor wafer is bonded to the planarized dielectric material of the handle wafer. The doner wafer may be substantially unpatterned for easiest bonding with no need for alignment between the donor and handle wafers. Alternatively, a patterned donor may be bonded with a bonding process capable of feature alignment. Large wafer format (e.g., 300 mm, or more) bonding platforms can now achieve very good alignment (<1 µm 1D feature edge to feature edge offset) between two bonded substrates. Although full-wafer bonding is advantageous, coupon or chiplet bonding may be similarly practiced to place multiple discrete device layers in direct contact with dielectric material of the handle wafer.

At block 425, the backside of the composite substrate is ground, polished, or otherwise etched back or cleaved off to expose a planar surface of device layer 206. Methods 401 then complete at output 435 where photonic device structures are fabricated in and/or upon the transferred device layer spanning both recessed and non-recessed zones of the substrate.

Figure 5A:
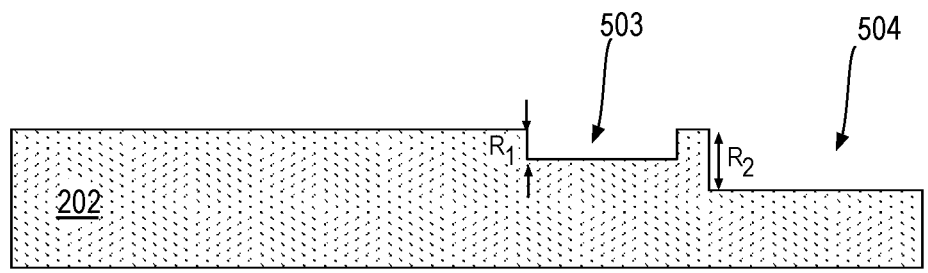
FIGS. 5A, 5B, 5C, 5D, 5E, 5F and 5G are cross-sectional views of the PIC depicted in FIG. 1 along the a-a' line as operations in the methods shown in FIG. 4 are practiced, in accordance with some embodiments.
Figure 5B:
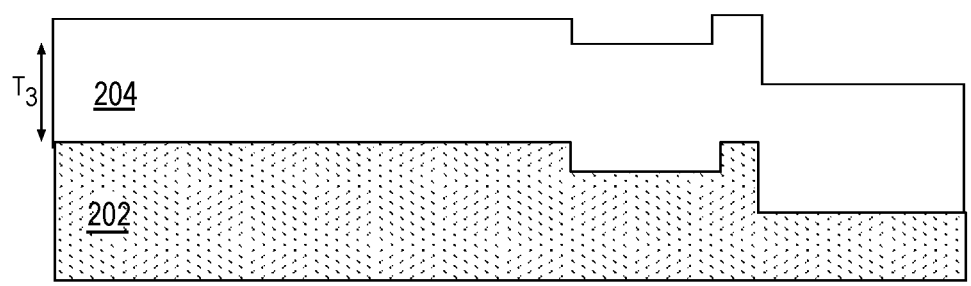
Figure 5C:
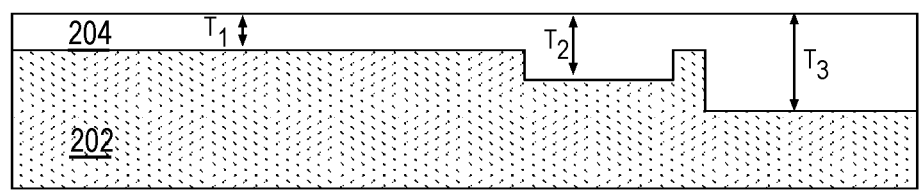
Figure 5D:
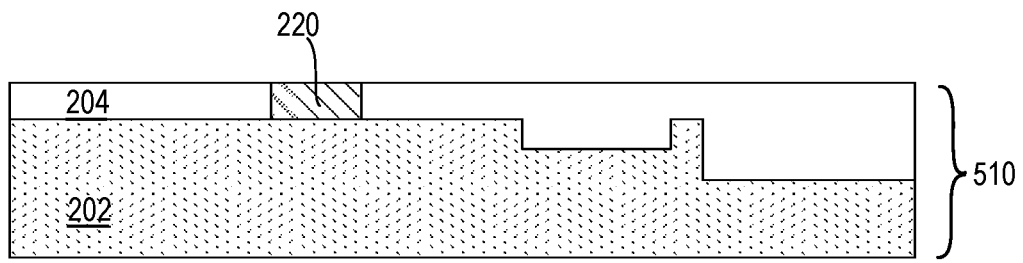
Figure 5E:
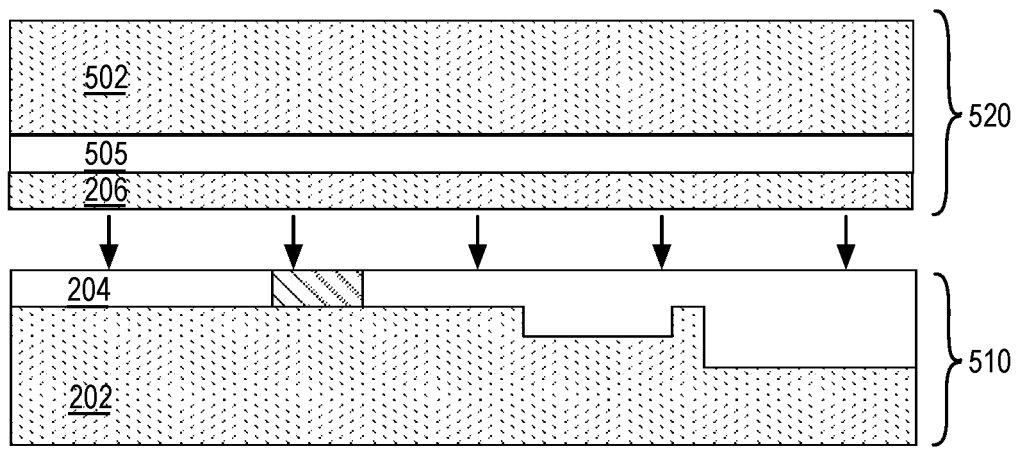
Figure 5F:
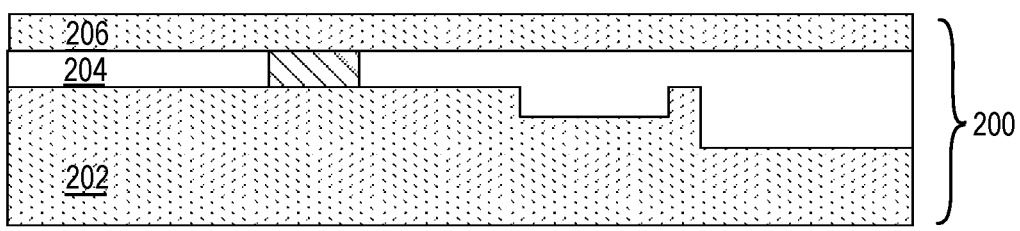
Figure 5G:
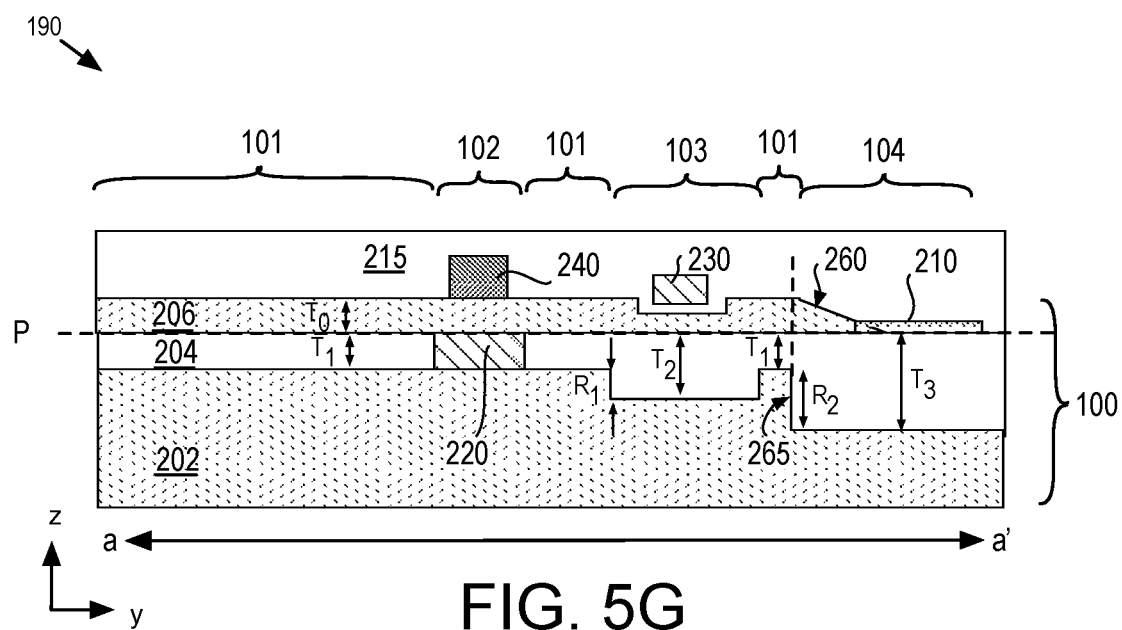

In the example further illustrated in FIG. 5E, an SOI substrate 520 includes semiconductor device layer 206 (e.g., silicon) separated from a substrate material 502 (e.g., silicon) by intervening dielectric material 505 (e.g., silica). An exposed surface of device 206 is bonded face-to-face with structured, multi-zoned handle substrate 510 to form a composite substrate. FIG. 5F further illustrates the composite substrate following removal of substrate material 502 (and dielectric material 505 to expose device layer 206. With device layer 206 exposed, any fabrication techniques known to be suitable for fabricating laser 130, modulator 125, de/mux 120, waveguide structure 115, or waveguide edge coupler 110 (FIG. 1) may be practiced to fabricate the PIC 190 substantially as illustrated in FIG. 5G, which is was introduced above as FIG. 2.

To fabricate PIC 190, one or more waveguide patterning processes may be performed to etch waveguide features into device layer 206 at locations aligned to the substrate zones 101-104. One or more impurity doping (e.g., implant) process may also be performed to dope device layer 206 with impurities that define regions of a particular conductivity type at locations aligned relative to the substrate zones. In some exemplary embodiments, device layer 206 is doped with donor impurities, such as phosphorus, arsenic, or antimony. In some alternative embodiments, a region of device layer 206 is doped p-type with acceptor impurities, such as boron.

To fabricate PIC 190, one or more dielectric deposition processes may be performed to clad waveguide structures patterned in device layer 206. For example, silica may be deposited with a chemical vapor deposition (CVD) process to predetermined thickness. One or more metallization processes may also be practiced to form any suitable metallization, such as, but not limited to, Cu, Al, Ru, W, Ti, Pt, Co, Ta, and their nitrides, silicides, carbides, or oxides. Metallizations may interconnect active optical devices with one or more transistors, which are also fabricated into the device layer of the multi-zoned, structured substrate. Any suitable transistor (e.g., MOSFET) fabrication process may be practiced to complete a PIC 190.

For the fabrication of PIC 190, optical absorption material and/or emission material may also be formed over certain lengths of a waveguide structure, for example to fabricate optical detectors or lasers. In exemplary embodiments, the absorption or emission material is formed with an epitaxial growth process with the top waveguide surface a seed for crystalline growth of the absorption or emission material. In alternative embodiments, the optical absorption or emission material on a discrete chiplet is bonded to the waveguide structure during fabrication of a PIC. Hence, PIC fabrication may comprise packaging/assembly techniques along with thin film processing techniques. In further embodiments, one or more optical fibers are assembled to PIC 190.

Figure 6:
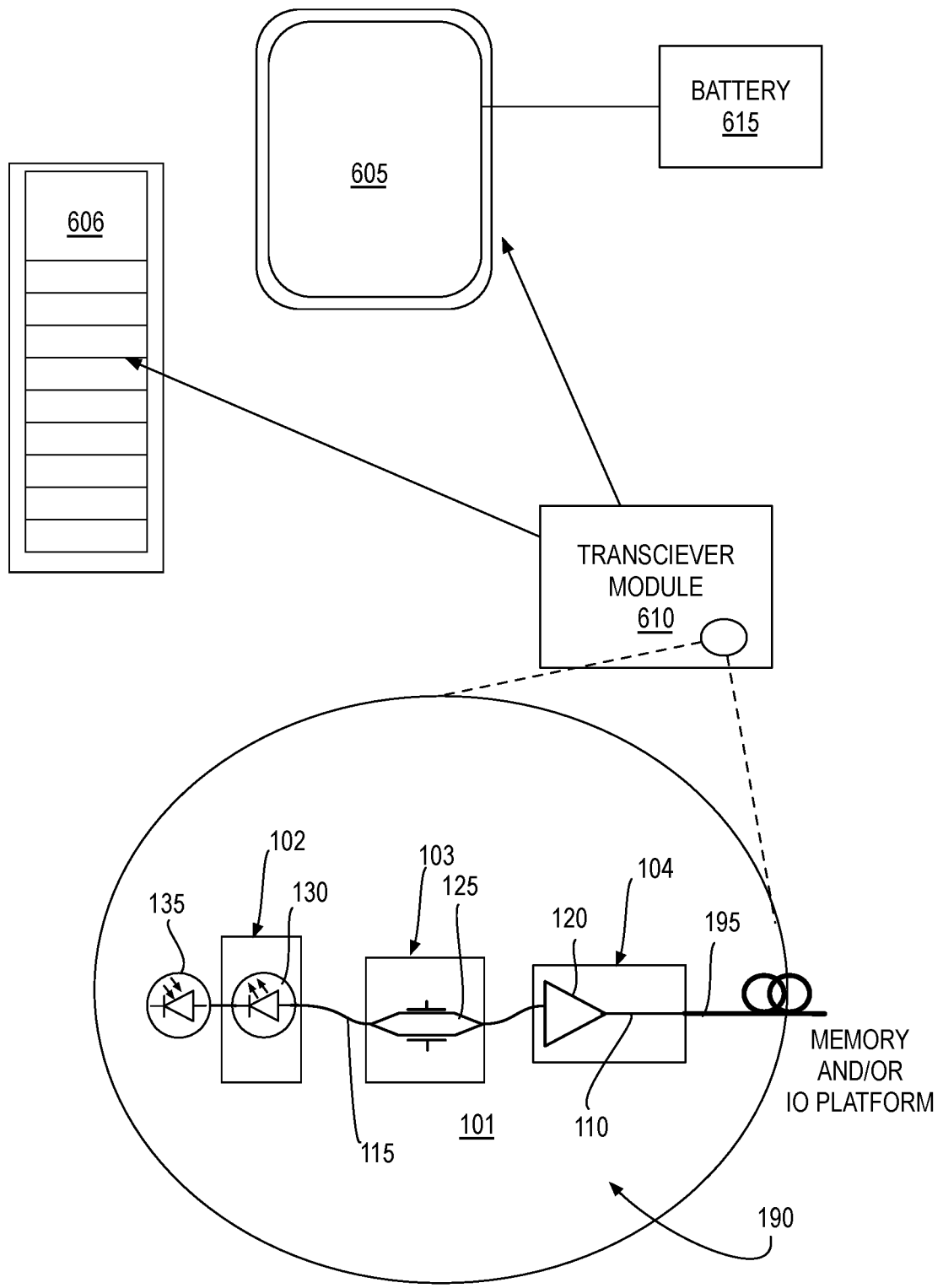
FIG. 6 illustrates a mobile computing platform and a data server machine employing an optical transceiver module including a PIC having a waveguide structures over a multi-zone substrate, in accordance with some embodiments.

FIG. 6 illustrates a mobile computing platform 605 and a data server machine 606 employing an optical transceiver module 610 that includes PIC 190. PIC 190 may be substantial as described above having one or more optical devices 110, 115, 120, 125, 130 within one or more substrate zones 101, 102, 103, 104. Server machine 606 may be any commercial server, for example including any number of high performance computing platforms disposed within a rack and networked together for electronic data processing, which in the exemplary embodiment includes transceiver module 610. Mobile computing platform 605 may be any portable device configured for each of electronic data display, electronic data processing, wireless electronic data transmission, or the like. For example, mobile computing platform 605 may be any of a tablet, a smart phone, laptop computer, etc., and may include a display screen (e.g., a capacitive, inductive, resistive, touchscreen), transceiver module 610 and a battery 615.

Figure 7:
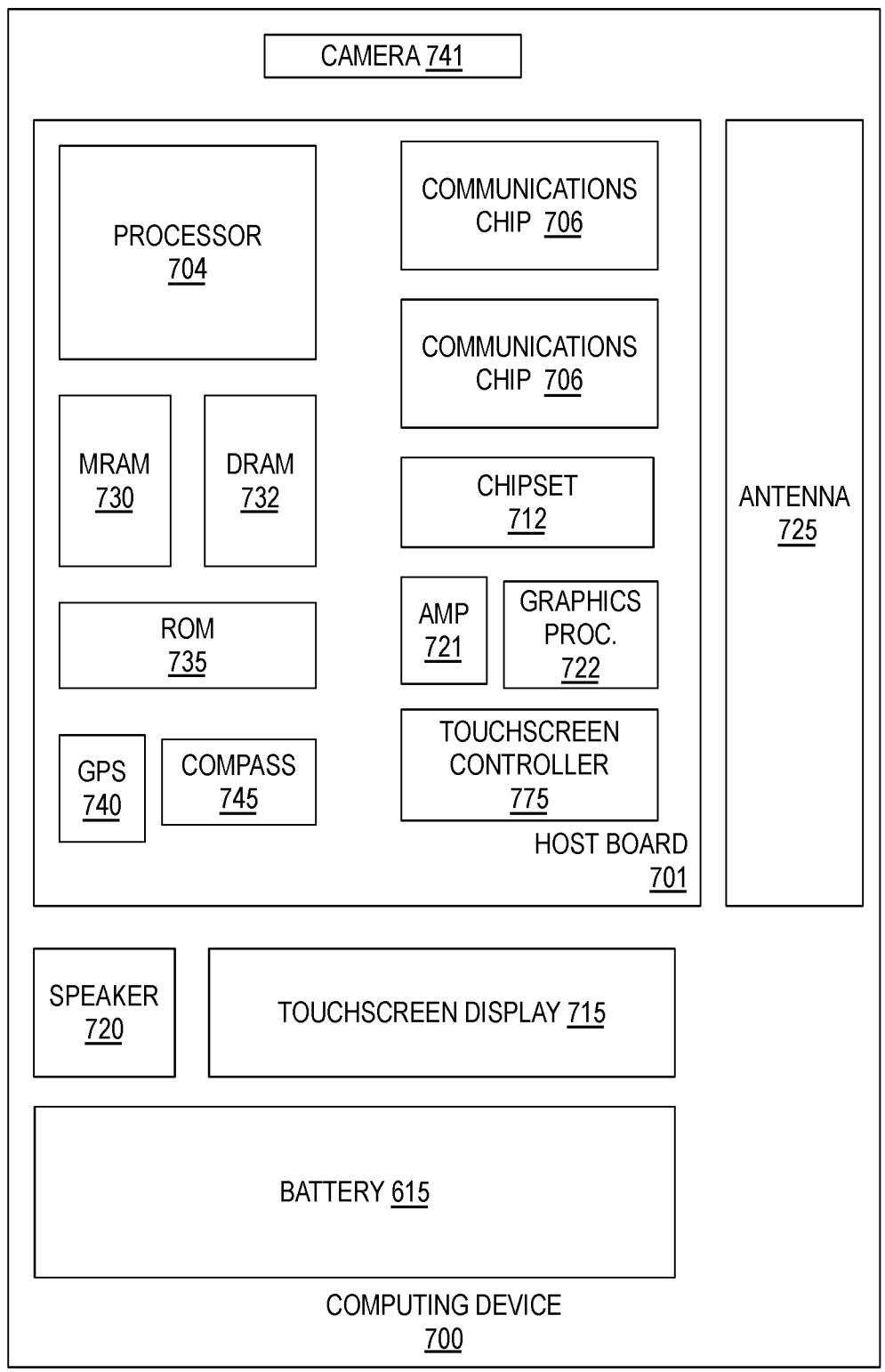
FIG. 7 is a functional block diagram of an electronic computing device, in accordance with an embodiment.

FIG. 7 is a functional block diagram of an electronic computing device, in accordance with some embodiments. Computing device 700 may be found inside platform 605 or server machine 606, for example. Device 700 further includes host board 701 hosting a number of components, such as, but not limited to, a processor 704 (e.g., an applications processor. In some examples, one or more of the components of device 700 includes a PIC comprising a multi-zoned substrate, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to processor 704. Depending on its applications, computing device 700 may include other components that may or may not be physically and electrically coupled to host board 701 These other components include, but are not limited to, volatile memory (e.g., DRAM 732), non-volatile memory (e.g., ROM 735 or MRAM 730), a graphics processor 722, an antenna 725, touchscreen display 715, touchscreen controller 775, battery 615, power amplifier 721, global positioning system (GPS) device 740, compass 745, speaker 720, camera, 741, and mass storage device (such as hard disk drive, solid-state drive (SSD), chipset 712, compact disk (CD), digital versatile disk (DVD), and so forth), or the like.

Communication chips 706 may enable wireless or optical communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In first examples, a photonic integrated circuit (PIC) comprises a multi-zone semiconductor on insulator (SOI) substrate comprising a first zone within which a crystalline silicon layer is spaced apart from an underlying substrate material by a first thickness of dielectric material comprising silicon and oxygen, and a second zone surrounded by the first zone, wherein within the second zone the crystalline silicon layer is spaced apart from the underlying substrate material by a second thickness of the dielectric material that is at least twice the first thickness. The PIC comprises a photonic waveguide structure on the multi-zone SOI substrate, wherein a first length of the waveguide structure is within the first zone and comprises the crystalline silicon, and a second length of the waveguide structure is within the second zone.

In second examples, for any of the first examples the second length of the waveguide structure comprises a compound of silicon and nitrogen. An interface between the dielectric material and crystalline silicon is coplanar with an interface between the dielectric material and the compound of silicon and nitrogen.

In third examples, for any of the first through second examples the waveguide structure further comprises a tapered length between the first length and second length. The tapered length is within the second zone, and the tapered length of the waveguide structure comprises the crystalline silicon.

In fourth examples, for any of the first through third examples the PIC comprises an optical edge coupler, and the optical edge coupler comprises the second length of the waveguide structure.

In fifth examples, for any of the third through fifth examples the PIC comprises an optical multiplexer or optical demultiplexer, and the optical multiplexer or optical demultiplexer comprises the second length of the waveguide structure.

In sixth examples, for any of the first through fifth examples the second length of the waveguide structure also comprises the crystalline silicon.

In seventh examples, for any of the third through sixth examples the PIC further comprises a resistive heater element over the second length of the waveguide structure.

In eighth examples, for any of the seventh examples the PIC further comprises an optical modulator, and the optical modulator comprises the second length of the waveguide structure and the resistive heater element.

In ninth examples, for any of the first through eighth examples the multi-zone SOI substrate further comprises a third zone surrounded by the first zone or the second zone. Within the third zone the crystalline silicon layer is spaced apart from the underlying substrate material by a thickness of a heat dissipation material that has a higher thermal conductivity than the dielectric material. A third length of the waveguide structure comprises the crystalline silicon and is within the third zone.

In tenth examples, the heat dissipation material comprises at least one of silicon or a metal.

In eleventh examples, for any of the first through tenth examples the heat dissipation material comprises at least one of W, Al or nitrogen.

In twelfth examples, for any of the third through eleventh examples the PIC further comprises a laser over the third length of the waveguide.

In thirteenth examples, for any of the first through twelfth examples further comprising a cladding material over the first and second lengths of the waveguide structure, the cladding material comprising silicon and oxygen, wherein the second zone has an area of at least 100 $\mu m^2$ and wherein the second thickness is at least 2 $\mu m$.

In fourteenth examples, a system comprises a power supply, and a photonic integrated circuit (PIC) coupled to the power supply. The PIC further comprises an optical device comprising a laser, modulator, or de/multiplexer, optical output coupler, a first optical waveguide structure coupling the optical device to the output coupler. The first optical waveguide structure comprises crystalline silicon within a first zone of a semiconductor on insulator (SOI) substrate, the first zone comprising the crystalline silicon spaced apart from an underlying substrate material by a first thickness of dielectric material comprising silicon and oxygen. The optical device or the output coupler comprises a second optical waveguide structure within a second zone of the SOI substrate, the second zone comprising the crystalline silicon layer, but spaced apart from the underlying substrate material by a second thickness of the dielectric material that is at least twice the first thickness.

In fifteen examples for any of fourteenth examples the second optical waveguide structure comprises a compound of silicon and nitrogen. An interface between the dielectric material and crystalline silicon is coplanar with an interface between the dielectric material and the compound of silicon and nitrogen.

In sixteenth examples a method of fabricating a photonic integrated circuit (PIC) comprises receiving a first substrate. The method comprises defining a first and second zone within the first substrate by patterning a recess into the second zone. The method comprises depositing a dielectric material over the first and second zones of the first substrate, the dielectric material comprising silicon and oxygen. The method comprises planarizing a surface of the dielectric material. The method comprises forming a multi-zone semiconductor-on-insulator (SOI) substrate by bonding the surface of the dielectric material to a crystalline silicon layer of a second substrate. The method comprises forming a waveguide on the multi-zone SOI substrate, wherein a first length of the waveguide structure is within the first zone and comprises the crystalline silicon layer, and a second length of the waveguide structure is within the second zone.

In seventeenth examples, for any of the sixteenth examples the second substrate is an SOI substrate comprising the crystalline silicon layer. The method further comprises expose a surface of the crystalline silicon layer opposite the dielectric material by thinning the multi-zone SOI substrate.

In eighteenth examples, for any of the sixteenth through seventeenth examples the method comprises depositing a heat dissipating material within the recess, the heat dissipating material having a higher thermal conductivity than the dielectric material.

In nineteenth examples, for any of the sixteenth through eighteenth examples the method comprises planarizing the heat dissipating material with a surface of the first zone of the substrate, and depositing the dielectric material over the first and second zones of the first substrate after planarizing the dissipating material.

In twentieth examples, for any of the nineteenth examples the heat dissipating material comprises at least one of Si, W, Al, or nitrogen.

In twenty-first examples, for any of the sixteenth examples the recess has an area of at least 100 $\mu m^2$ and a depth of at least 1 $\mu m$.

In twenty-second examples, for any of the sixteenth through twenty-first examples forming the PIC further comprises removing a portion of the crystalline silicon from within the second zone, depositing a compound comprising silicon and nitrogen on the dielectric material, and patterning the compound into the second waveguide structure.

It will be recognized that principles of the disclosure are not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A photonic integrated circuit (PIC) comprising:
a semiconductor on insulator (SOI) substrate comprising:
a first zone within which a crystalline silicon layer is spaced apart from an underlying substrate material by a first thickness of dielectric material comprising silicon and oxygen; and
a second zone surrounded by the first zone, wherein within the second zone the crystalline silicon layer is spaced apart from the underlying substrate material by a second thickness of the dielectric material that is at least twice the first thickness; and
a photonic waveguide structure on the SOI substrate, wherein a first length of the waveguide structure is within the first zone and comprises the crystalline silicon, and a second length of the waveguide structure is within the second zone.

2. The PIC of claim 1, wherein the second length of the waveguide structure comprises a compound of silicon and nitrogen, and wherein an interface between the dielectric material and crystalline silicon is coplanar with an interface between the dielectric material and the compound of silicon and nitrogen.

3. The PIC of claim 2, wherein the waveguide structure further comprises a tapered length between the first length and second length, wherein the tapered length is within the second zone, and wherein the tapered length of the waveguide structure comprises the crystalline silicon.

4. The PIC of claim 3, wherein the PIC comprises an optical edge coupler and the optical edge coupler comprises the second length of the waveguide structure.

5. The PIC of claim 3, wherein the PIC comprises an optical multiplexer or optical demultiplexer, and wherein the optical multiplexer or optical demultiplexer comprises the second length of the waveguide structure.

6. The PIC of claim 1, wherein the second length of the waveguide structure also comprises the crystalline silicon.

7. The PIC of claim 6, wherein the PIC further comprises a resistive heater element over the second length of the waveguide structure.

8. The PIC of claim 7, wherein the PIC further comprises an optical modulator, and wherein the optical modulator comprises the second length of the waveguide structure and the resistive heater element.

9. The PIC of claim 1, wherein:
the SOI substrate further comprises a third zone surrounded by the first zone or the second zone, wherein within the third zone the crystalline silicon layer is spaced apart from the underlying substrate material by a thickness of a heat dissipation material that has a higher thermal conductivity than the dielectric material; and
a third length of the waveguide structure comprises the crystalline silicon and is within the third zone.

10. The PIC of claim 9, wherein the heat dissipation material comprises at least one of silicon or a metal.

11. The PIC of claim 10, wherein the heat dissipation material comprises at least one of W, Al or nitrogen.

12. The PIC of claim 11, wherein the PIC further comprises a laser over the third length of the waveguide.

13. The PIC of claim 1, further comprising a cladding material over the first and second lengths of the waveguide structure, the cladding material comprising silicon and oxygen, wherein the second zone has an area of at least 100 $\mu m^2$ and wherein the second thickness is at least 2 $\mu m$.

14. A system, comprising:
a power supply; and
a photonic integrated circuit (PIC) coupled to the power supply, wherein the PIC further comprises:

an optical device comprising a laser, modulator, or de/multiplexer;

optical output coupler; and a first optical waveguide structure coupling the optical device to the output coupler, wherein:

the first optical waveguide structure comprises crystalline silicon within a first zone of a semiconductor on insulator (SOI) substrate, the first zone comprising the crystalline silicon spaced apart from an underlying substrate material by a first thickness of dielectric material comprising silicon and oxygen; and the optical device or the output coupler comprises a second optical waveguide structure within a second zone of the SOI substrate, the second zone comprising the crystalline silicon, but spaced apart from the underlying substrate material by a second thickness of the dielectric material that is at least twice the first thickness.

15. The system of claim 14, wherein the second optical waveguide structure comprises a compound of silicon and nitrogen, and wherein an interface between the dielectric material and crystalline silicon is coplanar with an interface between the dielectric material and the compound of silicon and nitrogen.

16. A method of fabricating a photonic integrated circuit (PIC), the method comprising:

receiving a first substrate;

defining a first and second zone within the first substrate by patterning a recess into the second zone;

depositing a dielectric material over the first and second zones of the first substrate, the dielectric material comprising silicon and oxygen;

planarizing a surface of the dielectric material;

forming a multi-zone semiconductor-on-insulator (SOI) substrate by bonding the surface of the dielectric material to a crystalline silicon layer of a second substrate; and forming a waveguide structure on the multi-zone SOI substrate, wherein a first length of the waveguide structure is within the first zone and comprises the crystalline silicon layer, and a second length of the waveguide structure is within the second zone.

17. The method of claim 16, wherein:

the second substrate is an SOI substrate comprising the crystalline silicon layer; and the method further comprises expose a surface of the crystalline silicon layer opposite the dielectric material by thinning the multi-zone SOI substrate.

18. The method of claim 16, further comprising depositing a heat dissipating material within the recess, the heat dissipating material having a higher thermal conductivity than the dielectric material.

19. The method of claim 18, further comprising planarizing the heat dissipating material with a surface of the first zone of the substrate, and depositing the dielectric material over the first and second zones of the first substrate after planarizing the dissipating material.

20. The method of claim 18, wherein the heat dissipating material comprises at least one of Si, W, Al, or nitrogen.

21. The method of claim 16, wherein the recess has an area of at least 100 $\mu m^2$ and a depth of at least 1 $\mu m$.

22. The method of claim 16, wherein forming the PIC further comprises:

removing a portion of the crystalline silicon from within the second zone;

depositing a compound comprising silicon and nitrogen on the dielectric material; and patterning the compound into the second waveguide structure.

* * * * *